United States Patent
Blezek et al.

(10) Patent No.: US 7,099,499 B2
(45) Date of Patent: Aug. 29, 2006

(54) FAT/WATER SEPARATION AND FAT MINIMIZATION MAGNETIC RESONANCE IMAGING SYSTEMS AND METHODS

(75) Inventors: Daniel Blezek, Niskayuna, NY (US); Paritosh Dhawale, Selkirk, NY (US); William Dixon, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 653 days.

(21) Appl. No.: 10/219,637

(22) Filed: Aug. 15, 2002

(65) Prior Publication Data

US 2004/0032977 A1 Feb. 19, 2004

(51) Int. Cl.
*G06K 9/00* (2006.01)

(52) U.S. Cl. ...................... 382/128; 382/130

(58) Field of Classification Search ............... 382/128, 382/130, 228; 128/922; 600/409; 356/39; 377/10; 324/309
See application file for complete search history.

(56) References Cited

U.S. PATENT DOCUMENTS

| | | | | |
|---|---|---|---|---|
| 6,016,057 A | | 1/2000 | Ma ............................ | 324/309 |
| 6,263,228 B1 | | 7/2001 | Zhang et al. ............... | 600/409 |
| 6,272,369 B1 | | 8/2001 | Tan ............................ | 600/410 |
| 6,586,933 B1 | * | 7/2003 | Hardy et al. ................ | 324/307 |
| 6,796,944 B1 | * | 9/2004 | Hall ........................... | 600/443 |
| 2003/0216644 A1 | * | 11/2003 | Hall ........................... | 600/437 |
| 2004/0004476 A1 | * | 1/2004 | Overall ....................... | 324/309 |
| 2004/0032977 A1 | * | 2/2004 | Blezek et al. ............... | 382/128 |
| 2004/0056660 A1 | * | 3/2004 | Yatsui et al. ................ | 324/309 |
| 2004/0174353 A1 | * | 9/2004 | Ando ......................... | 345/204 |
| 2005/0017717 A1 | * | 1/2005 | Duerk et al. ................ | 324/307 |
| 2005/0033154 A1 | * | 2/2005 | deCharms ................... | 600/410 |
| 2005/0070785 A1 | * | 3/2005 | Ahluwalia et al. .......... | 600/410 |
| 2005/0085713 A1 | * | 4/2005 | Reeder et al. .............. | 600/422 |
| 2005/0165295 A1 | * | 7/2005 | Li et al. ..................... | 600/410 |
| 2005/0165296 A1 | * | 7/2005 | Ma ............................ | 600/410 |

* cited by examiner

*Primary Examiner*—Duy M. Dang
(74) *Attorney, Agent, or Firm*—Fletcher Yoder

(57) ABSTRACT

Systems and methods for identifying the relative contribution of fat and water signals in a magnetic resonance ("MR") image including an algorithm operable for selecting an image signal model, selecting a scan parameter, forming a bias field estimate, applying a bias correction to a phase image, estimating the signal fraction of fat and water at each of a plurality of voxels, and forming a fat-suppressed image, a water-suppressed image, or a combination of a fat-based image and a water-based image. The ("MRI") fat suppression systems and methods requiring only a single image acquisition including an algorithm operable for selecting a relative phase of approximately $\theta=\pi/2$ or another suitable relative phase, employing an expectation maximization algorithm to classify the phase of the complex image, and projecting complex vectors into fat and water components to obtain fat and water images.

40 Claims, 10 Drawing Sheets

(a) Magnitude Image of Combined Images (b) Phase Image of Combined Images (c) Inhomogeneity Field (d) Biased Phase Image Field

(b) Zoomed View of Chemical Shift Artifact (a) Expanded View of Chemical Shift Artifact

*Figure 1*

(b) Vector Field Visualization (a) Magnitude Image

(b) Legs (a) Head

*Figure 4*

(b) Fat Image (a) Water Image

(a) Head Image (b) Leg Image

FAT/WATER SEPARATION AND FAT MINIMIZATION MAGNETIC RESONANCE IMAGING SYSTEMS AND METHODS

FIELD OF THE INVENTION

The present invention relates generally to magnetic resonance imaging ("MRI") systems and methods. More specifically, the present invention relates to systems and methods for removing/reducing the chemical shift artifact associated with MRI using a single echo pulse sequence and for minimizing the partial volume effect of fat along an MRI slice select direction, as well as the chemical shift of fat along an MRI read direction.

BACKGROUND OF THE INVENTION

Magnetic resonance imaging ("MRI") collects data in the Fourier domain, typically referred to as k-space, from the magnetic signals of protons precessing in a magnetic field. The spin frequency, also referred to as the resonance frequency, is a function of a material's gyromagnetic ratio and the strength of the magnetic field. In order to spatially position the collected signal, MRI systems and methods make an underlying assumption about this spin frequency: that the signal is composed primarily of protons in water. Typically, in the human body, this assumption is valid; however, protons in fat resonate at a lower frequency than protons in water. This resonance frequency difference is referred to as the chemical shift. When water and fat signals are imaged together, a resulting shift of the fat signal occurs. This frequency change in k-space results in a spatial shift in image space. During frequency encoding, the off resonance fat signal is interpreted to occur at a different spatial location from where the actual signal originated, producing a superposition of two offset images: an image of water and an image of fat response.

Figure 1:
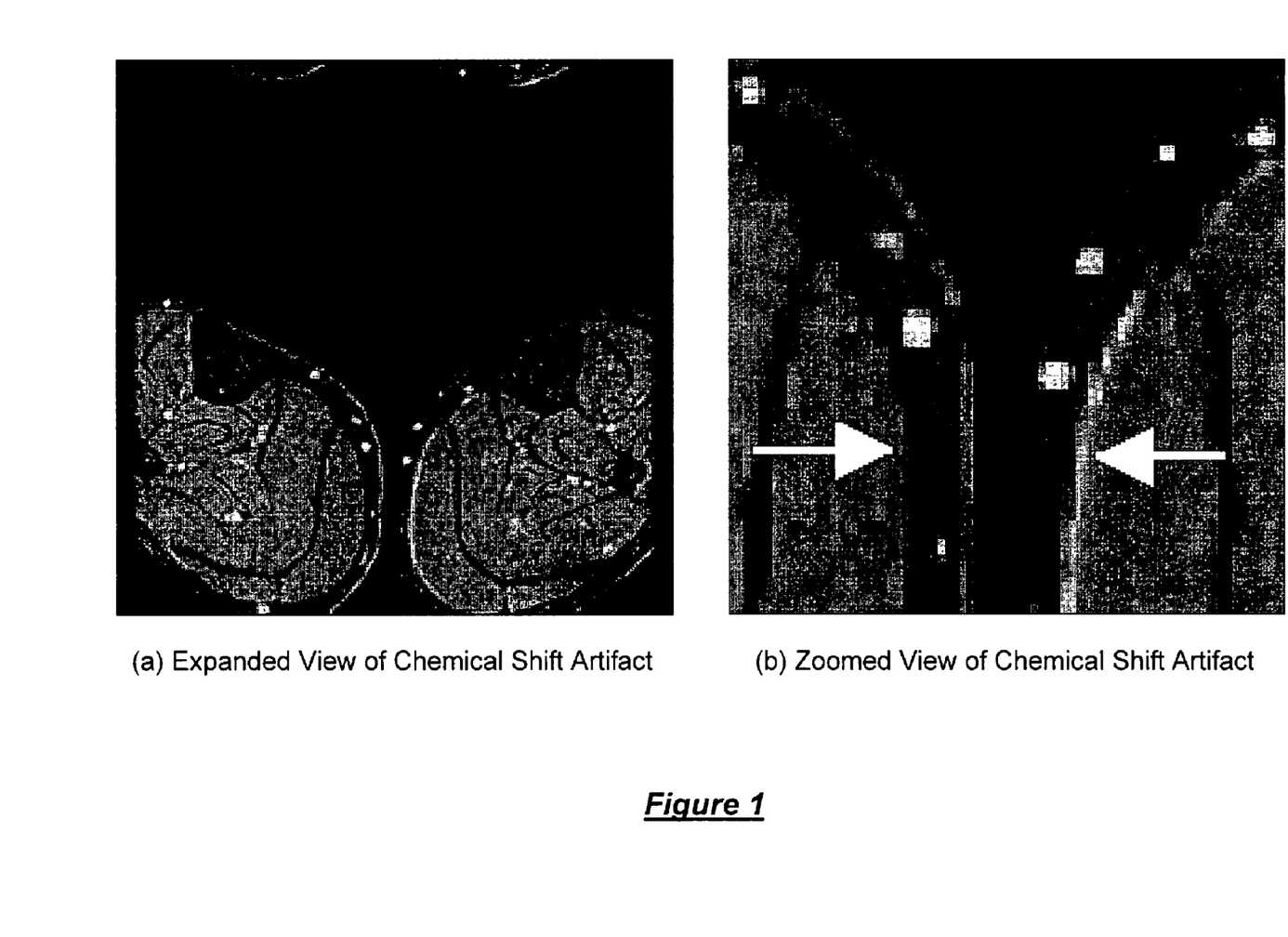
FIG. 1 is a magnetic resonance ("MR") image (expanded and zoomed view) of the "shadowing" effect in the phase encoding direction associated with a chemical shift artifact ("CSA")

The chemical shift artifact ("CSA") presents a significant barrier to the quantitative MR image analysis of small features, in which the amount of shift is comparable to the dimension of the object. The CSA appears as a "shadowing" effect in the read direction of MR images. This shadowing effect is illustrated in FIG. 1. The resonance frequency of fat is lower than that of water (by approximately 220 Hz given a 1.5 T field). The fat signal is reconstructed with a spatial shift proportional to the $B_0$ field, the field of view ("FOV") of the image, and the bandwidth used to acquire the signal. For example, given a 1.5 T magnet, a 20 cm FOV, a 256-pixel matrix, and a 20 kHz bandwidth, the resulting shift is 2.81 pixels, or 2.2 mm. Thus, an object composed of a water signal that is approximately 2.2 mm in size may be completely obscured. The borders of objects may also be corrupted by this artifact.

Typically, the resulting CSA corruption is "read through" by radiologists, however, by corrupting the borders between adjacent regions, it foils quantitative measurements of small water signal features surrounded by fat-containing tissue. The magnitude of the shift increases proportionally to the strength of the magnetic field, thus as $B_0$ field strength increases, the artifact's effects may also increase. This shift occurs primarily in the frequency encoding or read-out direction of the image; a secondary effect is present in the slice select direction of the image. Referring to FIG. 1, in the zoomed view (FIG. 1(b)), the CSA on the right leg appears as a void signal, as indicated by the arrow. In the left leg, the CSA appears as a high-intensity region where the fat and water signals superimpose, resulting in increased signal magnitude.

Although the CSA may be useful for diagnostic purposes, such as "fatty liver," etc., several methods have been proposed to counteract it. These are broadly categorized into two classes: fat saturation or suppression and the Dixon method.

Since its inception in 1984, the Dixon method has received much attention. The Dixon method seeks to remove the effects of the CSA by exploiting the phase relationships caused by the different resonance frequencies to produce two images: one with fat and water in phase and one with opposed phase. By choosing an echo time, TE, based on the chemical shift between fat and water, Dixon collected two images, one composed of fat and water signal in phase, and one with fat and water signals 180 degrees out of phase. The two images are added and subtracted to produce an image of the fat signal and of the water signal. In the following equations:

$$I_0 = S_{fat} + S_{water}$$

$$I_\pi = S_{fat} - S_{water}, \quad (1)$$

$I_0$ is the image collected with fat and water in phase and $I_\pi$ is the image collected with fat and water at opposed phases. The fat and water images may be formed from the two images by the following equations:

$$I_{fat} = (I_0 + I_\pi)/2$$

$$I_{water} = |I_0 - I_\pi|/2. \quad (2)$$

Dixon's original paper employed a simple method of addition and subtraction assuming that the only source of phase difference between the two signals was chemical shift. Intensity inhomogeneities, however, confound the two-point method, resulting in errors in the reconstructed images. This problem was addressed by Skinner and Glover and Coombs et al. Lodes et al. suggest the use of three images acquired at $\theta \in [-\pi, 0, \pi]$ to calculate the intensity inhomogeneities. This method has been extended to include a correction algorithm that fits a polynomial to the collected phase and performs trend analysis on the phase.

Inhomogeneity correction is a pivotal component of any proposed single-point Dixon method. As used herein, the terms bias or bias field mean the magnetic field inhomogeneities and magnetic susceptibility of the human body that cause spatially varying shading across MRI images. The bias filed affects both the magnitude and the phase of the collected signal. Although the bias field effects have been studied and simulated, in practice the bias field in MRI images is approached by fitting approximations to the field rather than understanding the underlying mechanisms. A substantial body of literature has been centered around intensity bias correction in MRI. Meyer et al. use an LCJ algorithm for intensity bias correction. Several authors use a polynomial fit or thin-plate splines. Non-parametric correction schemes have also shown promise in coping with bias correction. Rather than retrospectively correct the artifact, Schomberg incorporates correction steps in the MRI reconstruction process. Information theory methods and homomorphic unsharp masking have also been applied to the problem. Prima presented a comparison of model-based methods and several authors have coupled segmentation with intensity correction. It is an adaptation of coupled segmentation that forms the core of the fat suppression technique described herein.

In addition to the issues described above, to characterize tissues, the pixel values in two images are typically compared by division for T2*, T2, and diffusion. Although division may cancel some untoward effects, it is still necessary to remove/reduce the influences of surrounding and/or included fat. Fat may affect a plurality of surface voxels in small or thin tissue regions. The CSA moves fat in the slice select and read directions, producing overlap which may be several pixels wide. High bandwidth limits may alleviate this overlap, but increase noise.

Ideally, calculations would provide correct tissue properties (T2*, etc.) at partial volume fractions below a relatively large, critical value, and the correct values for fat at relatively large volume fractions. Because fat and water signal phases may affect results, TE choice may be used to minimize partial volume effects.

Thus what is still needed is a novel algorithm for distinguishing fat and water signals utilizing only one image, provided the correct phase information from the complex image may be accurately estimated. What is also needed is a novel algorithm for the robust estimation of parameters such as T2* that are adjacent to fat.

BRIEF SUMMARY OF THE INVENTION

As described above, magnetic resonance imaging ("MRI") fat-suppression techniques to overcome the chemical shift artifact ("CSA") have been computationally approached primarily by variations of the Dixon method. Multi-point, and specifically, three-point, methods dominate the literature. These methods estimate the contribution of fat and water signals by solving a set of equations using three echoes acquired with the relative phase of fat and water at $\theta \in [-\pi, 0, \pi]$. The systems and methods of the present invention, however, present a novel approach to fat suppression that requires only a single image acquisition. By choosing the relative phase to be approximately $\theta = \pi/2$ and employing an expectation maximization algorithm to classify the phase of the complex MR image, an estimate of the true phase of the image is obtained. From the phase estimate, fat and water images are obtained by projecting the complex vectors into fat and water components. The systems and methods of the present invention improve upon existing multi-point Dixon methods by reducing imaging time to a single image and eliminating the need for custom pulse sequence development. Mathematical and physical phantoms and clinically relevant results are reported.

The techniques of the present invention include a number of discrete steps. These steps include developing an image signal model, choosing the proper scan parameters, unwrapping the phase of an image, forming a bias field estimate, applying a bias correction to the phase image, estimating the partial volume of fat and water at each voxel, and forming a fat-suppressed image.

In one embodiment of the present invention, a system and a method for identifying the relative contribution of fat and water signals in a magnetic resonance ("MR") image include an algorithm operable for selecting an image signal model, selecting a scan parameter, forming a bias field estimate, applying a bias correction to a phase image, estimating the signal fraction of fat and water at each of a plurality of voxels, and forming a fat-suppressed image, a water-suppressed image, or a combination of a fat-based image and a water-based image.

In another embodiment of the present invention, a magnetic resonance imaging ("MRI") fat suppression system and method requiring only a single image acquisition include an algorithm operable for selecting a relative phase of approximately $\theta = \pi/2$ or another suitable relative phase, employing an expectation maximization algorithm to classify the phase of the complex image, and projecting complex vectors into fat and water components to obtain fat and water images.

Because fat and water have different precession frequencies giving rise to each, resulting in a chemical shift along the MRI read direction, as well as a phase relationship between the components of fat and water within a given voxel, the well-understood inter-relationship between the phase of the magnetization vectors may be used to make a parameter being estimated less sensitive to the partial volume of fat of an object of interest, such as water or fat. This may be accomplished by choosing appropriate acquisition parameters, such as TE.

In a further embodiment of the present invention, a method for minimizing a partial volume effect of fat and a chemical shift artifact associated with magnetic resonance ("MR") imaging includes selecting a predetermined range for the phase inter-relationship between fat and water, selecting a phase inter-relationship value between fat and water within the predetermined range, and estimating a tissue parameter using the phase inter-relationship value between fat and water. Preferably, the predetermined range for the phase inter-relationship between fat and water includes values between about 60 degrees and about 120 degrees, and, more preferably, about $\pi/2$. The tissue parameter estimated includes, for example, T1, T2, T2*, or diffusion.

In a still further embodiment of the present invention, a system operable for minimizing a partial volume effect of fat and a chemical shift artifact associated with magnetic resonance ("MR") imaging includes an algorithm operable for selecting a predetermined range for the phase inter-relationship between fat and water, selecting a phase inter-relationship value between fat and water within the predetermined range, and estimating a tissue parameter using the phase inter-relationship value between fat and water. Preferably, the predetermined range for the phase inter-relationship between fat and water includes values between about 60 degrees and about 120 degrees, and, more preferably, about $\pi/2$. The tissue parameter estimated includes, for example, T1, T2, T2*, or diffusion.

DETAILED DESCRIPTION OF THE INVENTION

Figure 2:
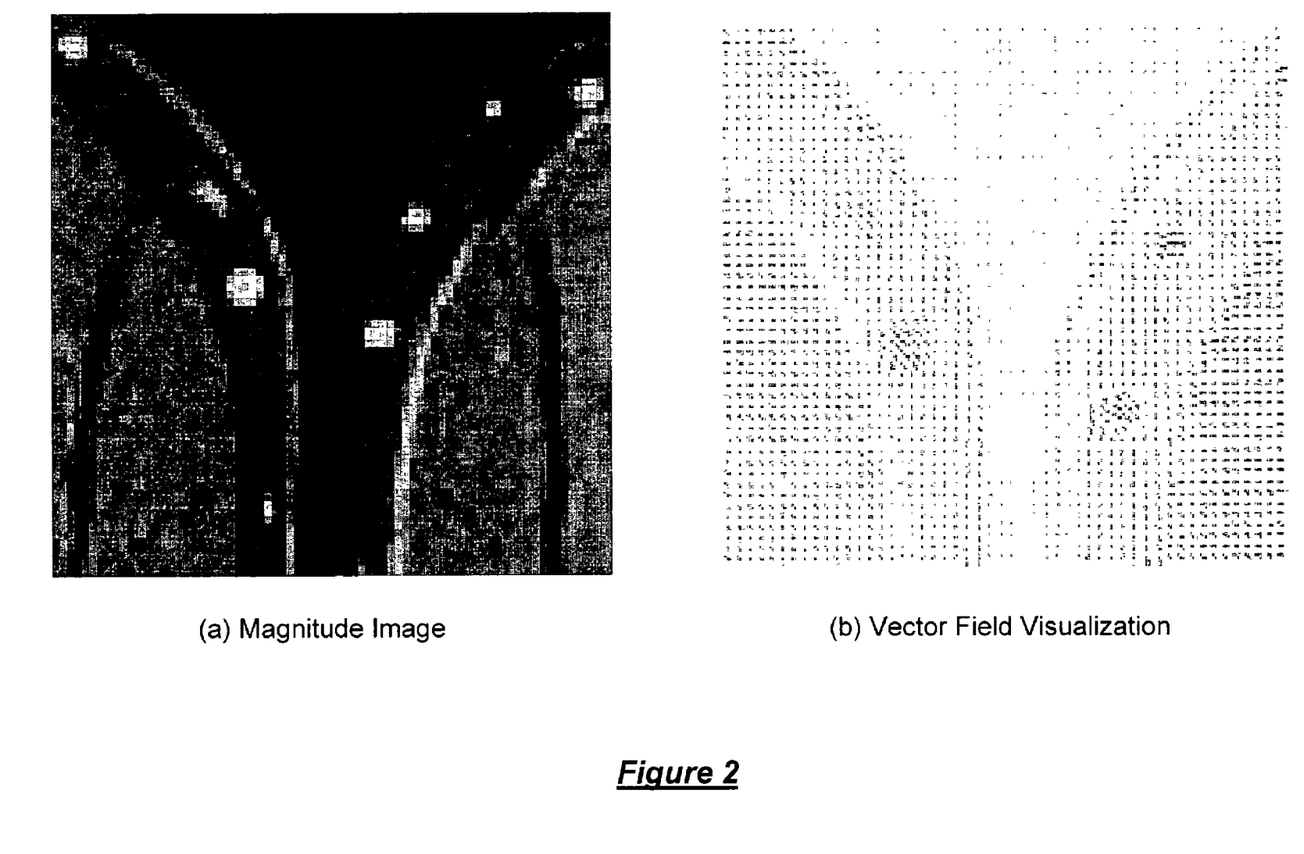
FIG. 2 is a magnitude image and a vector field visualization of one example of a bias field.

The systems and methods of the present invention utilize and represent a novel algorithm for identifying the contribution of fat and water signals in magnetic resonance ("MR") images. An MR image is formed from a population of protons precessing in a spectrum of magnetic resonance frequencies. The two most common frequencies correspond to water and fat. In a simplified form, the image is created according to the following equation:

$$I_{observed} = I_{water} + I_{fat} e^{-i2\pi\omega_f TE}, \quad (3)$$

where $I_{observed}$ is the observed, complex, image, $I_{fat}$ and $I_{water}$ are the fat and water signals, $\omega_f$ is the resonance frequency difference between fat and water, and TE is the time of the echo. From a known $\omega_f$ and a proper setting of TE, images may be acquired with the relative phase of fat and water at any desired value. Dixon used $\theta = \omega_f TE = [0, \pi]$ images to suppress the fat signal. A more complete model of image formation is provided by the following equation:

$$I_{observed} = (I_{water} + I_{fat} e^{-i2\pi\omega_f TE})\beta'$$

$$\beta' = \beta_{(x,y)} e^{-i\phi_{(x,y)}}, \quad (4)$$

where $\beta' = \beta_{(x,y)} e^{-i\phi_{(x,y)}}$ is the spatially-dependent bias field. The bias field correction algorithms mentioned previously attempt to estimate $\beta_{(x,y)}$ by taking the log magnitude of the observed image, as shown by the following equation:

$$\log(|I_{observed}|) = \log(|I_{object}|) + \log(|\beta'|), \quad (5)$$

where $I_{object}$ is the uncorrupted image. Setting $2\pi\omega_f TE = \pi/2$ by the proper choice of TE provides the following:

$$\angle I_{observed} = \angle(\beta' I_{water} + \beta' I_{fat} e^{-i2\pi\omega_f TE})$$

$$\angle I_{observed} = \theta = \theta_{object} + \phi_{(x,y)}, \quad (6)$$

where $\theta$ and $\theta_{object}$ are the observed and true phases, respectively. If $\phi_{(x,y)}$ may be estimated and removed, the true phase may be recovered. The true phase, $\theta_{object}$, of the resulting complex image may be used to decouple the fat and water signals from a single image into individual components. An example of the bias field is illustrated in FIG. 2. FIG. 2(*a*) illustrates a magnitude image of a leg, while FIG. 2(*b*) is an arrow plot of a similar region visualizing the complex data. Each complex vector is shown as a short arrow with the x and y axes corresponding to the real and imaginary components, respectively. This image was acquired with the $2\pi\omega_f TE = -\pi/2$ in the regions of muscle corresponding to a water signal, the vectors approximately at a phase of 0, while the fat signals are oriented at approximately $-\pi/2$. A close inspection of FIG. 2(*b*) reveals two distinct directions of vectors at approximately $-\pi/2$ relative phase. Also visible is the slowly varying clockwise additive field, an artifact not readily apparent in the magnitude image, which nonetheless corrupts the complex image.

Figure 3:
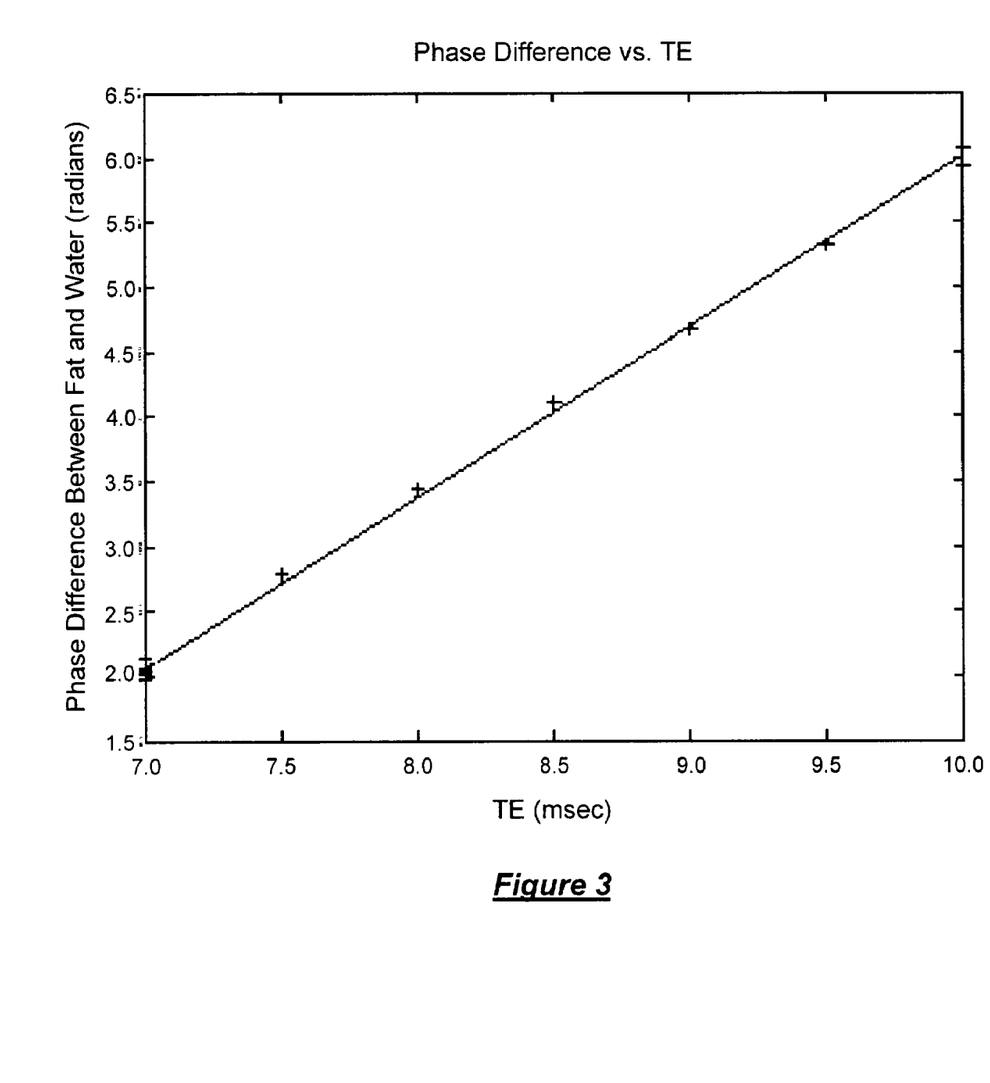
FIG. 3 is a plot of phase difference as a function of echo time, TE, as they relate to the systems and methods of the present invention.

In accordance with the systems and methods of the present invention, the chemical shift between fat and water was measured by taking a series of scans at different settings of TE. Regions of interest ("ROI") were selected in tissue where water signals predominate, and in fat dominated tissue. The ROIs were chosen in adjacent areas to minimize inhomogeneity effects. The average phase of the two tissues was compared to calculate the approximate resonance frequency difference in Hz between the two materials. FIG. 3 illustrates the data collected and a regression fit with $r^2 = 0.9988$. From this data, a chemical shift of 206 Hz was calculated between fat and water in a 1.5 T GE Signa scanner (General Electric Medical Systems, Milwaukee, Wis.). A gradient recalled echo pulse sequence was used. Because water protons precess 206 Hz faster than fat protons, every 4.85 msec the water protons accumulate one additional revolution as compared to the fat protons. The relative phase between the two materials is a function of TE: $\Delta TE = TE = TE/4.85$ msec. Water and fat are in phase at 4.85 msec, 9.70 msec, 14.55 msec, etc. The relative phase is $\pi/2$ at 6.06 msec, 10.91 msec, 15.76 msec, etc., and $-\pi/2$ at 8.49 msec, 13.34 msec, etc.

Figure 4:
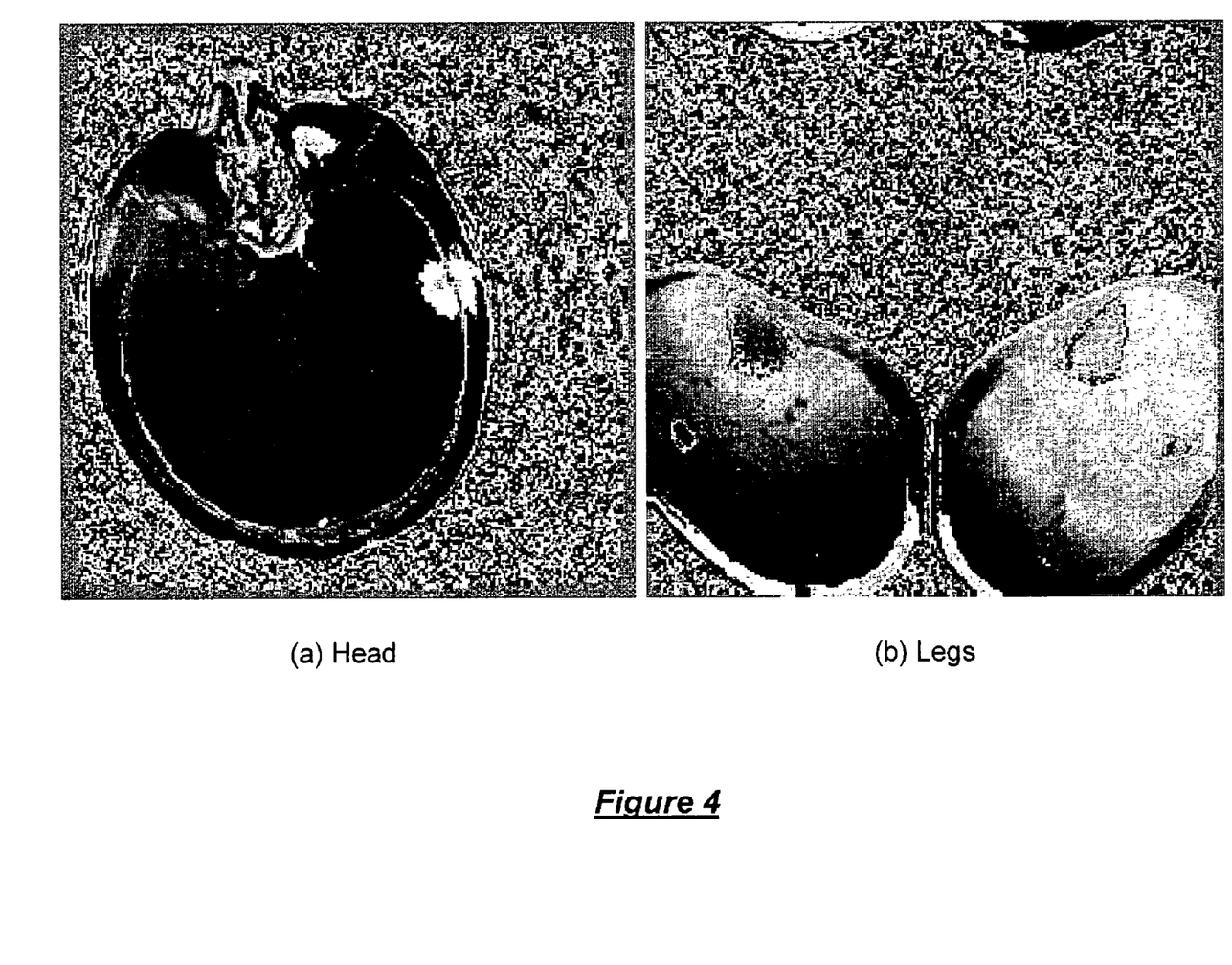
FIG. 4 is an MR image of a head (FIG. 4(a)) that includes an obvious phase discontinuity behind the left eye and near the left middle meningeal artery and legs (FIG. 4(b)) with a phase wrap in the posterior portion of the legs at the boundary between the leg muscle and the subcutaneous fat layer.

A phase unwrapping step is used to estimate the correct phase from complex MRI images. The collected image data is wrapped to $\theta \in [-\pi, \pi]$. Examples are illustrated in FIG. 4. The head image (FIG. 4(*a*)) includes an obvious phase discontinuity behind the left eye and near the left middle meningeal artery. In FIG. 4(*b*), a phase wrap occurs in the posterior portion of the legs at the boundary between the leg muscle and the subcutaneous fat layer. In both images, the phase of the background regions is caused by noise.

A minimum spanning tree ("MST")-based phase unwrapping algorithm was implemented. Fundamentally, the MST algorithm performs region growing, choosing the next pixel to add to the region based on a weight. Edge weights are formed between two pixels $p_i$ and $p_j$ as follows:

$$W_{i,j} = \text{mod}_{-\pi,\pi}(\phi_i - \phi_j), \quad (7)$$

where $\text{mod}_{-\pi,\pi}$ maps the phase difference to the range $[-\pi,\pi]$ by adding or subtracting multiples of $2\pi$ and $\phi_x$ is the wrapped phase of pixel $p_x$.

The pixel with the highest magnitude is chosen as the seed point. Its unwrapped phase, $\theta_{seed}$, is set to its wrapped phase, $\phi_{seed}$. At each step, the minimum edge weight of all of the border pixels is found and the corresponding border pixel ($p_i$) is added to the MST. As the pixel is added to the MST, its unwrapped phase is calculated using the following equation:

$$\theta_i = \phi_i + \text{mod}_{-\pi,\pi}(\phi_i - \theta_j), \quad (8)$$

where $\theta_x$ is the unwrapped phase of pixel $p_x$. The algorithm terminates when all pixels have been added to the MST and the unwrapped image is saved.

The expectation maximization ("EM") algorithm described by Wells is well suited for allowing the estimation and correction of this artifact, recovering the true phase of the underlying signal. The EM approach utilizes a priori information about the classes of tissues to concurrently segment the image and provide an estimate of the bias field corruption. In a refinement of the EM algorithm, a non-Gaussian model is introduced to compensate for an "other" class of tissue, i.e., CSF, skull, background, etc., improving the performance of the EM algorithm. Van Leemput et al.

add the additional step of updating the class means and variances of the EM algorithm. The techniques of the present invention present an adaptation of these algorithms for the purpose of fat suppression in MR imaging.

The techniques of the present invention involve the Bayesian estimation of the inhomogeneity artifact. Several modifications are made to adapt the Wells EM algorithm to phase images. Rather than model tissue classes corresponding to anatomic features, two classes representing resonance signal phase from water and fat are used. The uniformly distributed "other" class proposed by Guillemaud and Brady is incorporated to account for the phase of background pixels. The bias field modeled by Wells was of a multiplicative nature; in phase images it is additive, thus removing the step of computing a logarithmic transformation of the data. Whereas Wells selects tissue class means and variances from an atlas of previous scans, the mean class parameter for water signal is arbitrarily set to 0; that of fat is calculated from TE. Empirically, the variance of both classes was set to 0.2 and the "other" class probability was set to 0.3.

The observed phases are modeled as Gaussian distributions as follows:

$$p(\theta_i | \Gamma_{water}, \beta_i) = G(\theta_i - \mu_{water} - \beta_i, \phi_{water})$$

$$p(\theta_i | \Gamma_{fat}, \beta_i) = G(\theta_i - \mu_{fat} - \beta_i, \phi_{fat}), \quad (9)$$

where $\theta_i$ is the unwrapped, observed phase at pixel i, $\Gamma \in$ [water, fat] is the tissue class, $\mu_{water}$, $\phi_{water}$ and $\mu_{fat}$, $\phi_{fat}$ are the class means and variances of the water and fat classes, respectively, and $G(x,\phi)$ is a Gaussian distribution function with zero mean and $\phi$ variance, evaluated at x. The bias field is denoted herein over all pixels as $\beta$ and is modeled as a zero mean Gaussian prior probability density, as per Wells. Under the assumption that the bias field and tissue classes are statistically independent, the conditional probability of observed phase given a bias field $\beta$ is:

$$p(\theta_i | \beta_i) = \sum_{\Gamma i} p(\theta_i, \Gamma_i | \beta_i)$$
$$= \sum_{\Gamma i} p(\theta_i, | \Gamma_i, \beta_i) p(\Gamma_i),$$

where $p(\Gamma_i)$ is a stationary prior probability distribution on the tissue class.

Here, the systems and methods of the present invention deviate from Wells, adopting the approach of Guillemaud and Brady introducing the uniformly distributed "other" class as $\Gamma_{other}$, producing the following set of equations:

$$p(\theta_i | \beta_i) = p(\theta_{water} | \Gamma_{water}) p(\Gamma_{water}) + p(\theta_{fat} | \Gamma_{fat}) p(\Gamma_{fat}) + p(\Gamma_{other}) \quad (11)$$

$$W_{i,j} = (p(\theta_i | \Gamma_j, \beta_i) p(\Gamma_j)) \Big/ \Big( \sum_{rj} p(\theta_i, |\Gamma_j, \beta_i) p(\Gamma_j) \Big)$$

$$R_i = W_{i, j=water}(\theta_i - \mu_{water}) \varphi_{water} + W_{i,j=fat}(\theta_i - \mu_{fat}) \varphi_{fat}$$

$$\beta = HR,$$

where $p(\Gamma_{other})$ is a uniform distribution. It should be noted that the bias field $\beta$ is estimated with respect to the Gaussian classes $\Gamma_{water}$ and $\Gamma_{fat}$, and is the ratio of a low pass filtered mean residual and mean inverse covariance matrices.

Van Leemput et al. introduce a third step in the EM algorithm. In addition to the estimation of the class weights and the inhomogeneity field, estimates of the class parameters are performed using the following equations (adapted to phase images):

$$\mu_j = (\Sigma_i p(\Gamma_i = j | \theta_i)(\theta_i - \beta_i))/(\Sigma_i p(\Gamma_i = j | \theta_i))$$

$$\phi_j = (\Sigma_i p(\Gamma_i = j | \theta_i)(\theta_i - \mu_j - \beta_i)^2)/(\Sigma_i p(\Gamma_i = j | \theta_i)), \quad (12)$$

where $j \in$ [water, fat].

Two approaches may be used to generate distinct water and fat images. The first approach uses $W_{ij}$ to calculate the intensity contributions of the water and fat signals. Alternatively, the $\beta$ inhomogeneity field estimate may be used to correct the complex data and re-project the vector field into water and fat images.

Figure 5:
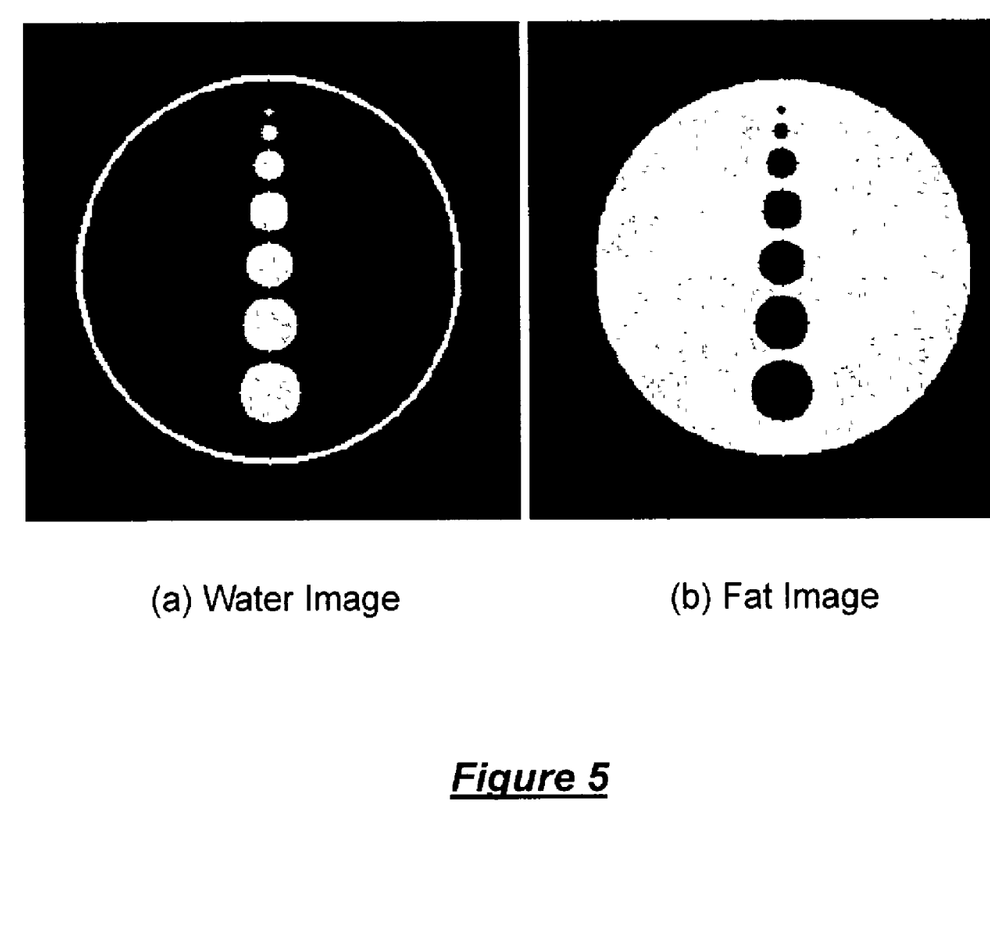
FIG. 5 is an MR image (water and fat) associated with a mathematical phantom, constructed to evaluate the systems and methods of the present invention.
Figure 6:
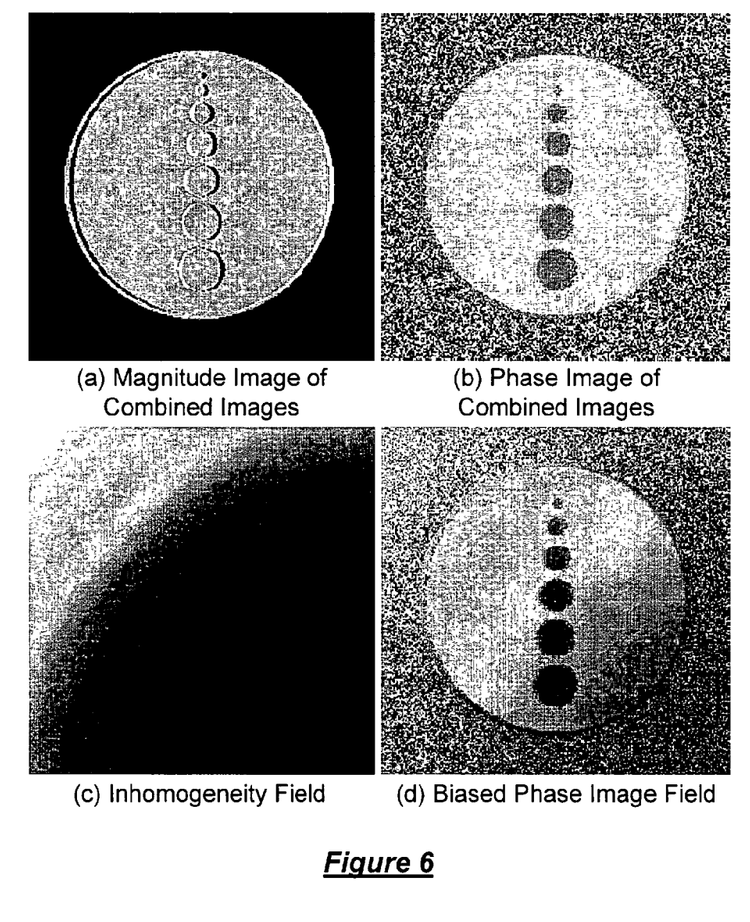
FIG. 6 is another MR image (water and fat) associated with the mathematical phantom, constructed to evaluate the systems and methods of the present invention.

In order to evaluate the approaches described above, a mathematical phantom was constructed. The phantom was constructed by forming water and fat images. These images are illustrated in FIG. 5. The water image has a 3-pixel outer layer and circles of increasing size embedded in a fat background. The fat image is shifted 2.8 pixels relative to the water image to simulate a CSA and combined with the water image. Random white noise was added to both components of the complex images at 10% amplitude to form a simulated image. Referring to FIG. 6, FIG. 6(a) shows the magnitude with the phase shown in FIG. 6(b). An inhomogeneity field (FIG. 6(c)) was constructed using the following equation and added to the phase image, creating FIG. 6(d):

$$\beta(x,y) = \pi/8 + 3/4\pi(\cos(\pi/2 + \pi x/2) + \cos(\pi/2 + \pi x/2)), \quad (13)$$

where x,y are image coordinates in the range [0, 1]. The original Wells and Guillemaud algorithms were run independently and then in conjunction with the Van Leemput enhancements. The resulting root mean square ("RMS") error between the extracted water signal and known water signal were calculated and are displayed in Table 1. The original Dixon technique is also included in the table; because the algorithm does not estimate the bias field, it is not included in the results.

TABLE 1

Algorithm Comparison

| Algorithm | RMS$_{water}$ | RMS$_{field}$ |
|---|---|---|
| Wells | 12.027191 | 0.367528 |
| Guillemaud | 6.196007 | 0.127467 |
| Wells & Van Leemput | 24.930277 | 0.454563 |
| Guillemaud & Van Leemput | 6.767336 | 1.672937 |
| Dixon | 27.010386 | — |

The Guillemaud algorithm provided the most accurate performance on the mathematical phantom data; and the addition of the "other" class improved the original Wells results in the phantom study. This improvement is demonstrated quantitatively in the volunteer data described herein below.

WORKING EXAMPLE

Figure 7:
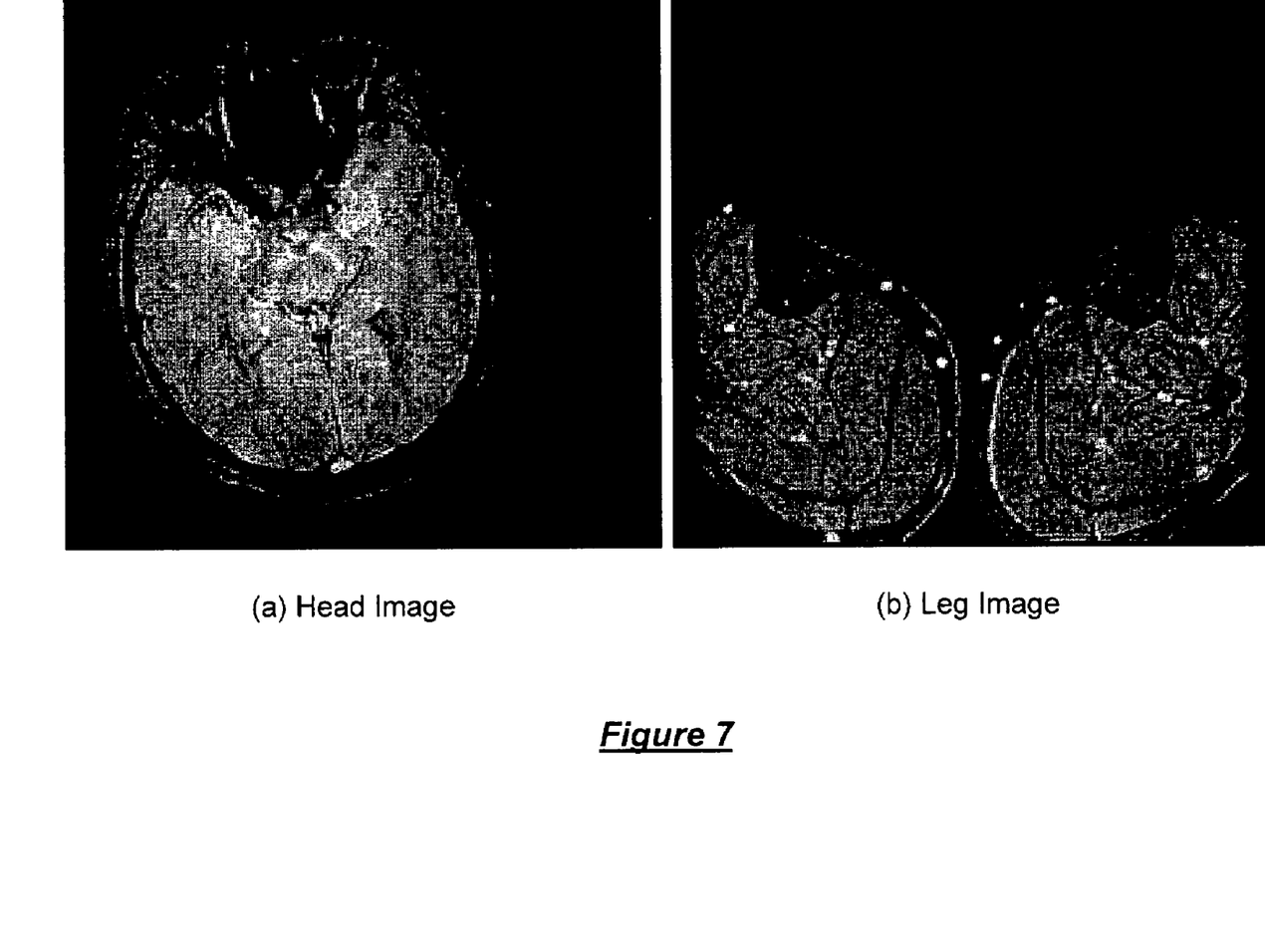
FIG. 7 is an MR image (head and legs) of two normal, healthy volunteers acquired using the systems and methods of the present invention.
Figure 8:
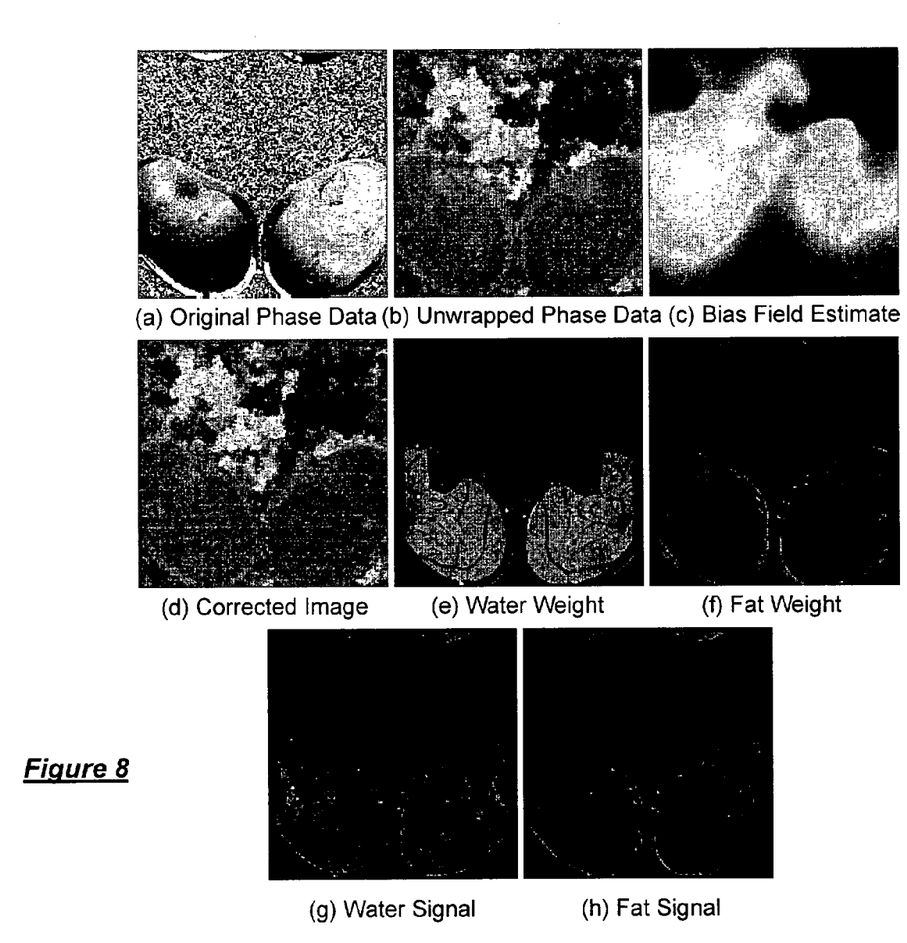
FIG. 8 is another MR image (head and legs) of two normal, healthy volunteers acquired using the systems and methods of the present invention.
Figure 9:
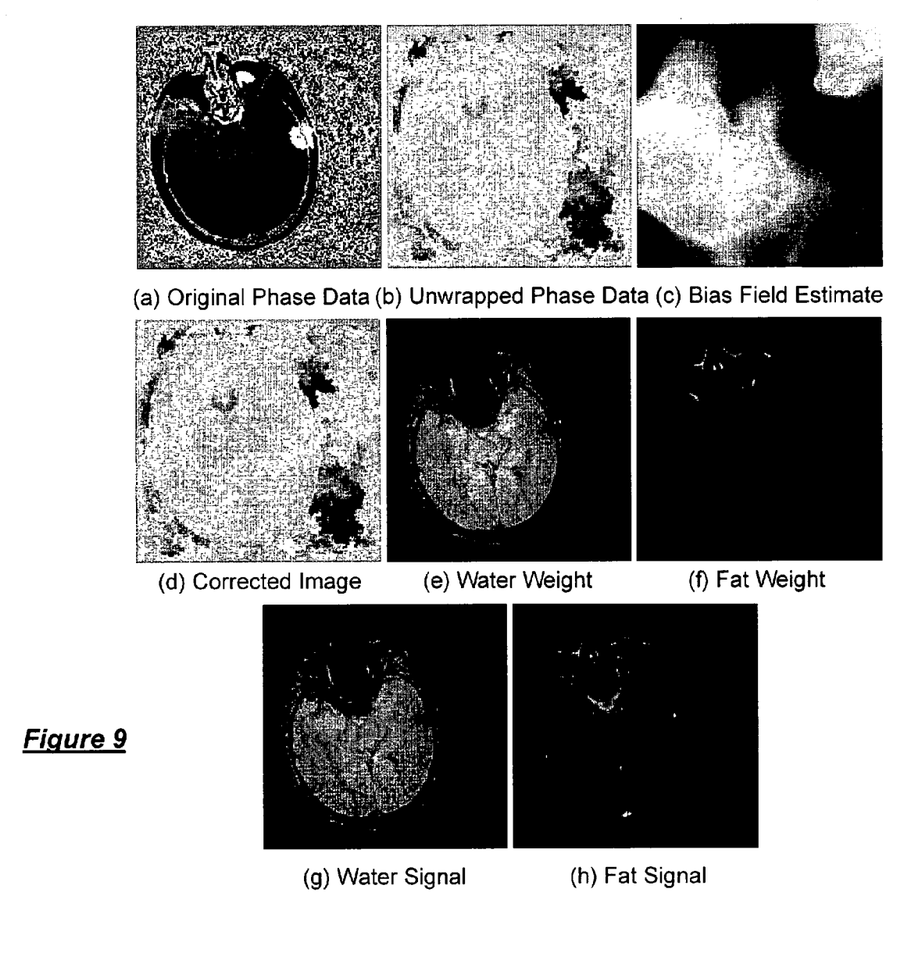
FIG. 9 is a further MR image (head and legs) of two normal, healthy volunteers acquired using the systems and methods of the present invention.

Images of two normal, healthy volunteers were acquired. One dataset was of the head and another was of the legs, as illustrated in FIG. 7. The head dataset was acquired using a GRE sequence on a 1.5 T GE Signa scanner with TE/TR of 6.1 msec/700 msec and 42 degrees flip angle. Magnitude, real and imaginary images were saved by the scanner. The leg dataset was acquired on the same scanner with 9 msec/117 msec TE/TR times and 20 degrees flip angle. The complex data was preprocessed using the phase unwrapping algorithm described above. The Guillemaud algorithm with $\phi_{water}=\phi_{fat}=0.2$, $\Gamma_{water}=0$, $\Gamma_{fat}=\mod_{2\pi}(TE/4.85 \text{ msec})$, and $\Gamma_{other}=0.3$. The results are illustrated in FIGS. 8 and 9.

Figure 10:
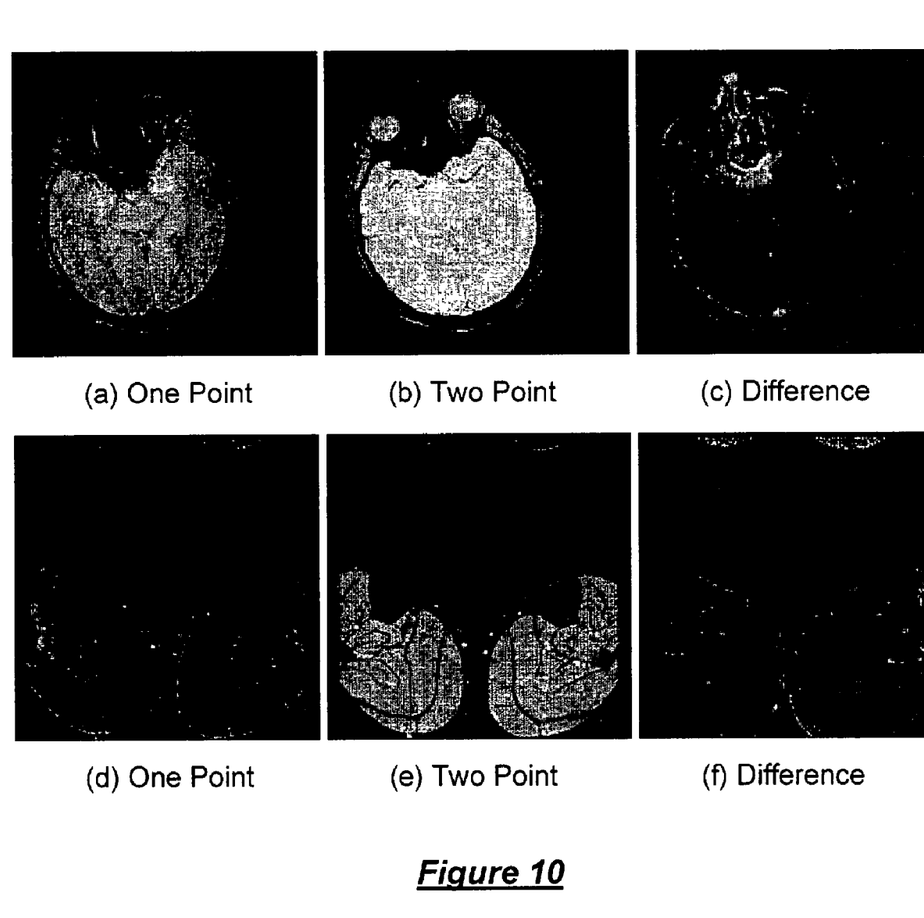
FIG. 10 is an MR image (head and legs) acquired using a two-point Dixon method for comparison purposes with the systems and methods of the present invention.

The extended two-point Dixon method was implemented for comparison purposes, with the results illustrated in FIG. 10. No attempt was made to register the resulting images. Mis-registration artifacts may be seen in the "difference" images (FIGS. 10(c) and 10(f)). The single-point method provides qualitatively good performance in both head and leg images. Barring the motion artifact of the right eye, the single-point method performs on par with the two-point method, suppressing the fat signal occluding the optic nerve (FIG. 10(a)). In FIG. 10(d), several areas of artifact may be observed in the skin surface. While the two-point Dixon method faithfully preserves the outer skin surface, the single-point method fails due to the close proximity of air pixels with random phase that foils the inhomogeneity field estimate.

Dual gradient echo images with various TEs were also compared by simulation, phantom studies, and volunteer studies. These comparisons included echo pairs with water and fat phase differences of 0, π/2, and π, and mixed cases. Using an optimal choice of acquisition parameters, the partial volume effect of fat was minimized along the MRI slice select direction. Using these optimal fat and water signals, the effect of chemical shift-induced overlap was also minimized in the MRI read direction.

Fat contamination degrades T2* and similar inter-image comparisons. Errors are minimized when fat and water are π/2 out of phase in both images. For gradient echo images, the choice of TE fixes the phase difference. Single echo imaging requires separate control of Hahn and gradient echoes. Controlling fat effects allows a lower bandwidth to be used, producing higher signal-to-noise ratio, S/N, images.

It is apparent that there has been provided, in accordance with the systems and methods of the present invention, a means for removing/reducing the chemical shift artifact associated with MRI using a single echo pulse sequence and for minimizing the partial volume effect of fat along an MRI slice select direction, as well as the chemical shift of fat along an MRI read direction. Although the systems and methods of the present invention have been described with reference to preferred embodiments and examples thereof, other embodiments and examples may perform the same function and/or achieve similar results. All such equivalent embodiments and examples are within the spirit and scope of the present invention and are intended to be covered by the following claims:

What is claimed is:

1. A method for identifying the relative contributions of signals of a first substance and a second substance in a magnetic resonance ("MR") image, the method comprising:
    selecting an image signal model;
    selecting a scan parameter;
    forming a bias field estimate;
    applying a bias correction to a phase image;
    estimating a signal fraction of the first substance and the second substance at each of a plurality of voxels; and
    forming a suppressed image with respect to the first substance or the second substance.

2. The method of claim 1, wherein the image signal model comprises the following equations:

$$I_{observed}=(I_{water}+I_{fat}e^{-i2\pi\omega_f TE})\beta'$$

$$\beta'=\beta_{(x,y)}e^{-i\phi_{(x,y)}},$$

wherein $\beta'=\beta_{(x,y)}e^{-i\phi_{(x,y)}}$ is a spatially-dependent bias field.

3. The method of claim 2, wherein the image signal model further comprises the following equations:

$$\angle I_{observed}=\angle(\beta'I_{water}+\beta'I_{fat}e^{-i2\pi\omega_f TE})$$

$$\angle I_{observed}=\theta=\theta_{object}+\phi_{(x,y)},$$

wherein θ and $\theta_{object}$ are observed and true phases, respectively.

4. The method of claim 3, further comprising estimating and removing φ(x,y) to recover the true phase.

5. The method of claim 4, further comprising using the true phase to decouple the signals of the first substance and the second substance from the image into individual components.

6. The method of claim 1, wherein choosing a scan parameter comprises choosing an echo time, TE.

7. The method of claim 1, further comprising calculating a chemical shift between the first substance and the second substance.

8. The method of claim 1, further comprising acquiring the image using a pulse sequence comprising a pulse sequence selected from the group consisting of gradient recalled echo pulse sequence, a spin echo pulse sequence, and a fast spin echo pulse sequence.

9. The method of claim 1, further comprising unwrapping the phase of the image.

10. The method of claim 9, wherein unwrapping the phase of the image comprises implementing a minimum spanning tree ("MST")-based phase unwrapping algorithm.

11. The method of claim 10, wherein unwrapping the phase of the image further comprises determining the minimum edge weight of a border pixel and adding the border pixel, $p_i$, to the MST.

12. The method of claim 11, wherein unwrapping the phase of the image further comprises calculating the unwrapped phase of the border pixel.

13. The method of claim 12, wherein unwrapping the phase of the image further comprises terminating the MST-based phase unwrapping algorithm when each of a plurality of pixels have been added to the MST.

14. The method of claim 1, further comprising modeling observed phases as Gaussian distributions according to the following equations:

$$p(\theta_i|\Gamma_{water},\beta_i)=G(\theta_i-\mu_{water}-\beta_i,\phi_{water})$$

$$p(\theta_i|\Gamma_{fat},\beta_i)=G(\theta_i-\mu_{fat}-\beta_i,\phi_{fat}),$$

wherein $\theta_i$ is the unwrapped, observed phase at pixel i, Γ ∈ [water, fat] is a tissue class, $\mu_{water}$, $\phi_{water}$ and $\mu_{fat}$, $\phi_{fat}$ are class means and variances of water and fat classes, respectively, and G(x,φ) is a Gaussian distribution function with zero mean and φ variance, evaluated at x.

15. The method of claim 14, further comprising using a conditional probability of observed phase given a bias field β:

$$p(\theta_i|\beta_i) = \Sigma_{\Gamma_i} p(\theta_i, \Gamma_i|\beta_i)$$
$$= \Sigma_{\Gamma_i} p(\theta_i|\Gamma_i,\beta_i)p(\Gamma_i),$$

wherein $p(\Gamma_i)$ is a stationary prior probability distribution on the tissue class.

16. The method of claim 15, further comprising introducing a uniformly distributed "other" class, $\Gamma_{other}$, producing the following equations:

$$p(\theta_i|\beta_i) = p(\theta_{water}|\Gamma_{water}) + p(\Gamma_{water}) + p(\theta_{fat}|\Gamma_{fat})p(\Gamma_{fat}) + p(\Gamma_{other})$$

$$W_{ij} = (p(\theta_i|\Gamma_j,\beta_i)p(\Gamma_j))/(\Sigma_j p(\theta_i|\Gamma_j,\beta_i)p(\Gamma_j))$$

$$R_i = W_{i,j=water}(\theta_i - \mu_{water})\phi_{water} + W_{i,j=fat}(\theta_i - \mu_{fat})\phi_{fat}$$

$$\beta = H R,$$

wherein $p(\Gamma_{other})$ is a uniform distribution.

17. The method of claim 16, further comprising estimating class parameters using the following equations:

$$\mu_j = (\Sigma_i p(\Gamma_i = j|\theta_i)(\theta_i - \beta_i))/(\Sigma_i p(\Gamma_i = j|\theta_i))$$

$$\phi_j = (\Sigma_i p(\Gamma_i = j|\theta_i)(\theta_i - \mu_j - \beta_i)^2)/(\Sigma_i p(\Gamma_i = j|\theta_i)),$$

wherein $j \in$ [water, fat].

18. The method of claim 1, further comprising generating images associated with the first substance and the second substance by calculating the intensity contributions of the signals of the first substance and the second substance.

19. The method of claim 1, further comprising generating images associated with the first substance and the second substance by correcting complex image data and re-projecting a vector field into the images associated with the first substance and the second substance.

20. The method of claim 1, further comprising forming an image that represents a combination of the first substance and the second substance.

21. A system operable for identifying the relative contributions of signals of a first substance and a second substance in a magnetic resonance ("MR") image, the system comprising:
an algorithm operable for:
selecting an image signal model;
selecting a scan parameter;
forming a bias field estimate;
applying a bias correction to a phase image;
estimating a signal fraction of the first substance and the second substance at each of a plurality of voxels; and
forming a suppressed image with respect to the first substance or the second substance.

22. The system of claim 21, wherein the image signal model comprises the following equations:

$$I_{observed} = (I_{water} + I_{fat}e^{-i2\pi\omega \frac{TE}{f}})\beta'$$

$$\beta' = \beta_{(x,y)}e^{-i\phi_{(x,y)}},$$

wherein $\beta' = \beta_{(x,y)}e^{-i\phi_{(x,y)}}$ is a spatially-dependent bias field.

23. The system of claim 22, wherein the image signal model further comprises the following equations:

$$\angle I_{observed} = \angle(\beta' I_{water} + \beta' I_{fat}e^{-i2\pi\omega \frac{TE}{f}})$$

$$\angle I_{observed} = \theta = \theta_{object} + \phi_{(x,y)},$$

wherein $\theta$ and $\theta_{object}$ are observed and true phases, respectively.

24. The system of claim 23, wherein the algorithm is further operable for estimating and removing $\phi(x,y)$ to recover the true phase.

25. The system of claim 24, wherein the algorithm is further operable for using the true phase to decouple the signals of the first substance and the second substance from the image into individual components.

26. The system of claim 21, wherein choosing a scan parameter comprises choosing an echo time, TE.

27. The system of claim 21, wherein the algorithm is further operable for calculating a chemical shift between the first substance and the second substance.

28. The system of claim 21, wherein the algorithm is further operable for acquiring the image using a pulse sequence comprising a pulse sequence selected from the group consisting of a gradient recalled echo pulse sequence, a spin echo pulse sequence, and a fast spin echo pulse sequence.

29. The system of claim 21, wherein the algorithm is further operable for unwrapping the phase of the image.

30. The system of claim 29, wherein unwrapping the phase of the image comprises implementing a minimum spanning tree ("MST")-based phase unwrapping algorithm.

31. The system of claim 30, wherein unwrapping the phase of the image further comprises determining the minimum edge weight of a border pixel and adding the border pixel, $p_i$, to the MST.

32. The system of claim 31, wherein unwrapping the phase of the image further comprises calculating the unwrapped phase of the border pixel.

33. The system of claim 32, wherein unwrapping the phase of the image further comprises terminating the MST-based phase unwrapping algorithm when each of a plurality of pixels have been added to the MST.

34. The system of claim 21, wherein the algorithm is further operable for modeling observed phases as Gaussian distributions according to the following equations:

$$p(\theta_i|\Gamma_{water},\beta_i) = G(\theta_i - \mu_{water} - \beta_i, \phi_{water})$$

$$p(\theta_i|\Gamma_{fat},\beta_i) = G(\theta_i - \mu_{fat} - \beta_i, \phi_{fat}),$$

wherein $\theta_i$ is the unwrapped, observed phase at pixel i, $\Gamma \in$ [water, fat] is a tissue class, $\mu_{water}$, $\phi_{water}$ and $\mu_{fat}$, $\phi_{fat}$ are class means and variances of water and fat classes, respectively, and $G(x,\phi)$ is a Gaussian distribution function with zero mean and $\phi$ variance, evaluated at x.

35. The system of claim 34, wherein the algorithm is further operable for using a conditional probability of observed phase given a bias field $\beta$:

$$p(\theta_i | \beta_i) = \Sigma_{\Gamma_i} p(\theta_i, \Gamma_i | \beta_i)$$
$$= \Sigma_{\Gamma_i} p(\theta_i | \Gamma_i, \beta_i) p(\Gamma_i),$$

wherein $p(\Gamma_i)$ is a stationary prior probability distribution on the tissue class.

36. The system of claim 35, wherein the algorithm is further operable for introducing a uniformly distributed "other" class, other, producing the following equations:

$$p(\theta_i|\beta_i) = p(\theta_{water}|\Gamma_{water})p(\Gamma_{water}) + p(\theta_{fat}|\Gamma_{fat})p(\Gamma_{fat}) + p(\Gamma_{other})$$

$$W_{ij} = (p(\theta_i|\Gamma_j,\beta_i)p(\Gamma_j))/(\Sigma_j p(\theta_i|\Gamma_j,\beta_i)p(\Gamma_j))$$

$$R_i = W_{i,j=water}(\theta_i - \mu_{water})\phi_{water} + W_{i,j=fat}(\theta_i - \mu_{fat})\phi_{fat}$$

$$\beta = H R,$$

wherein $p(\Gamma_{other})$ is a uniform distribution.

37. The system of claim 36, wherein the algorithm is further operable for estimating class parameters using the following equations:

$$\mu_j = (\Sigma_i p(\Gamma_i = j|\theta_i)(\theta_i - \beta_i))/(\Sigma_i p(\Gamma_i = j|\theta_i))$$

$$\phi_j = (\Sigma_i p(\Gamma_i = j|\theta_i)(\theta_i - \mu_i - \beta_i)^2)/(\Sigma_i p(\Gamma_i = j|\theta_i)),$$

wherein j ∈ [water, fat].

38. The system of claim 21, wherein the algorithm is further operable for generating images associated with the first substance and the second substance by calculating the intensity contributions of the signals of the first substance and the second substance.

39. The system of claim 21, wherein the algorithm is further operable for generating images associated with the first substance and the second substance by correcting complex image data and re-projecting a vector field into the images associated with the first substance and the second substance.

40. The system of claim 21, wherein the algorithm is further operable for forming an image that represents a combination of the first substance and the second substance.

* * * * *